(12) United States Patent
Chang et al.

(10) Patent No.: US 10,121,918 B2
(45) Date of Patent: Nov. 6, 2018

(54) OPTICAL MODULE FOR PREVENTING CROSS TALK DUE TO UNDESIRABLE REFECTION LIGHT, MANUFACTURING PROCESS THEREOF AND ELECTRONIC DEVICE COMPRISING THE SAME

(71) Applicant: ADVANCED SEMICONDUCTOR ENGINEERING, INC., Kaohsiung (TW)

(72) Inventors: Jung-Hsuan Chang, Kaohsiung (TW); Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/795,613

(22) Filed: Jul. 9, 2015

(65) Prior Publication Data
US 2016/0013223 A1 Jan. 14, 2016

(30) Foreign Application Priority Data
Jul. 9, 2014 (CN) .......................... 2014 1 0325218

(51) Int. Cl.
*G01S 7/499* (2006.01)
*H01S 5/026* (2006.01)
(Continued)

(52) U.S. Cl.
CPC ........ *H01L 31/0232* (2013.01); *G01S 7/4813* (2013.01); *G01S 7/499* (2013.01);
(Continued)

(58) Field of Classification Search
CPC ............................. G01S 7/499; H01S 5/18355
See application file for complete search history.

(56) References Cited

U.S. PATENT DOCUMENTS 5,874,730 A 2/1999 Yi et al.
2006/0237674 A1* 10/2006 Iott ........................ E03C 1/057
251/129.04
(Continued)

FOREIGN PATENT DOCUMENTS

CN 1146041 A 3/1997
CN 101017100 A 8/2007
(Continued)

OTHER PUBLICATIONS

Office Action for Chinese Patent Application No. 201410325218.4 dated Jun. 20, 2016, including search report.
(Continued)

*Primary Examiner* — Daniel Whalen
(74) *Attorney, Agent, or Firm* — Foley & Lardner LLP; Cliff Z. Liu (57) ABSTRACT

The present disclosure relates to an optical module. In an embodiment, the optical module includes a carrier, a light source, a light detector, and a first polarizer. The light source and the light detector are disposed adjacent to a first surface of the carrier. The first polarizer is disposed on the light detector. The optical module is configured to polarize light emitted from the light source into a first polarization direction substantially perpendicular to a second polarization direction of light permitted through the first polarizer.

23 Claims, 7 Drawing Sheets

(51) Int. Cl.
*H01L 27/144* (2006.01)
*H01L 31/0232* (2014.01)
*H01L 31/18* (2006.01)
*G01S 17/02* (2006.01)
*G01S 7/481* (2006.01)
*H01S 5/183* (2006.01)

(52) U.S. Cl.
CPC ............ *G01S 17/026* (2013.01); *H01L 31/18* (2013.01); *H01L 27/1446* (2013.01); *H01S 5/18355* (2013.01); *Y02P 70/521* (2015.11)

(56) References Cited

U.S. PATENT DOCUMENTS

| | | | |
|---|---|---|---|
| 2007/0181790 A1* | 8/2007 | Chin | G01D 5/345 250/231.13 |
| 2008/0006762 A1 | 1/2008 | Fadell et al. | |
| 2008/0180667 A1 | 7/2008 | Okuno | |
| 2009/0310119 A1* | 12/2009 | Lam | G01B 11/168 356/33 |
| 2010/0211354 A1* | 8/2010 | Park | G01V 8/12 702/165 |
| 2010/0258710 A1 | 10/2010 | Wiese et al. | |
| 2012/0074301 A1* | 3/2012 | Kroese | G01J 1/0488 250/226 |
| 2014/0197306 A1* | 7/2014 | Wang | H03K 17/941 250/221 |
| 2014/0210998 A1* | 7/2014 | Pawlik | G07D 7/12 348/135 |

FOREIGN PATENT DOCUMENTS

| | | |
|---|---|---|
| CN | 101173894 A | 5/2008 |
| CN | 101755224 A | 6/2010 |
| CN | 102395859 A | 3/2012 |
| CN | 202472026 U | 10/2012 |
| DE | 19924470 A1 | 9/2000 |
| WO | WO-2012/168333 | 12/2012 |

OTHER PUBLICATIONS

Search Report for Chinese Patent Application No. 201410325218.4, dated Jun. 14, 2017, 1 page.
Search Report for Chinese Patent Application No. 201410325218.4, dated Dec. 29, 2017, 1 page.

* cited by examiner

Prior Art

FIG. 1A

Prior Art

FIG. 1B

Prior Art

OPTICAL MODULE FOR PREVENTING CROSS TALK DUE TO UNDESIRABLE REFECTION LIGHT, MANUFACTURING PROCESS THEREOF AND ELECTRONIC DEVICE COMPRISING THE SAME

CROSS-REFERENCE TO RELATED PATENT APPLICATIONS

This application claims the benefit of and priority to P.R.C. (China) Patent Application No. 201410325218.4, filed 9 Jul. 2014, the contents of which are incorporated herein by reference in their entirety.

BACKGROUND

1. Technical Field

The present disclosure relates to an optical module, a manufacturing process thereof, and an electronic device comprising the same.

2. Description of the Related Art

An optical module, such as a proximity sensor, may be used to detect an object in proximity to the optical module. The optical module may include a light source and an optical detector, where the optical detector can receive or detect a light emitted from the light source and reflected from an object so that the proximity of the object can be detected.

When an optical detector receives a light that is not emitted by the light source of the optical detector and reflected from a proximate object there may be "cross talk," which can decrease sensitivity of the optical detector. It is desirable to reduce such cross talk.

SUMMARY

One aspect of the present disclosure relates to an optical module. The optical module includes a carrier, a light source, a light detector, and a first polarizer. The light source and the light detector are disposed adjacent to a first surface of the carrier. The first polarizer is disposed on the light detector. The optical module is configured to polarize light emitted from the light source into a first polarization direction substantially perpendicular to a second polarization direction of light permitted through the first polarizer. In an embodiment, the light detector includes a photosensitive area disposed on an upper surface of the light detector, and the first polarizer covers the photosensitive area.

Another aspect of the present disclosure relates to an electronic device. In an embodiment, the electronic device comprises an optical module and a transparent sheet. The optical module includes a carrier, a light source, a light detector, and a first polarizer. The light source and the light detector are disposed adjacent to a first surface of the carrier. The first polarizer is disposed on the light detector. The optical module is configured to polarize light emitted from the light source into a first polarization direction substantially perpendicular to a second polarization direction of light permitted through the first polarizer. In an embodiment, the light detector includes a photosensitive area disposed on an upper surface of the light detector, and the first polarizer covers the photosensitive area. The transparent sheet has a first surface and a second surface opposite to the first surface, and the first surface of the transparent sheet faces the first surface of the carrier.

Another aspect of the present disclosure relates to a process of manufacturing an optical module. In an embodiment, the process comprises: providing a carrier, the carrier having a first surface; disposing a light source structure adjacent to the first surface, the light source structure configured to emit light in a first polarization direction; and disposing a light detection structure adjacent to the first surface, the light detection structure configured to admit light in a second polarization direction; wherein the first polarization direction is substantially perpendicular to the second polarization direction. In an embodiment, the light detector includes a photosensitive area adjacent to an upper surface of the light detector, and the first polarizer covers the photosensitive area.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are used to describe a certain component or certain plane of a component with respect to the orientation shown in the respective figure(s). It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
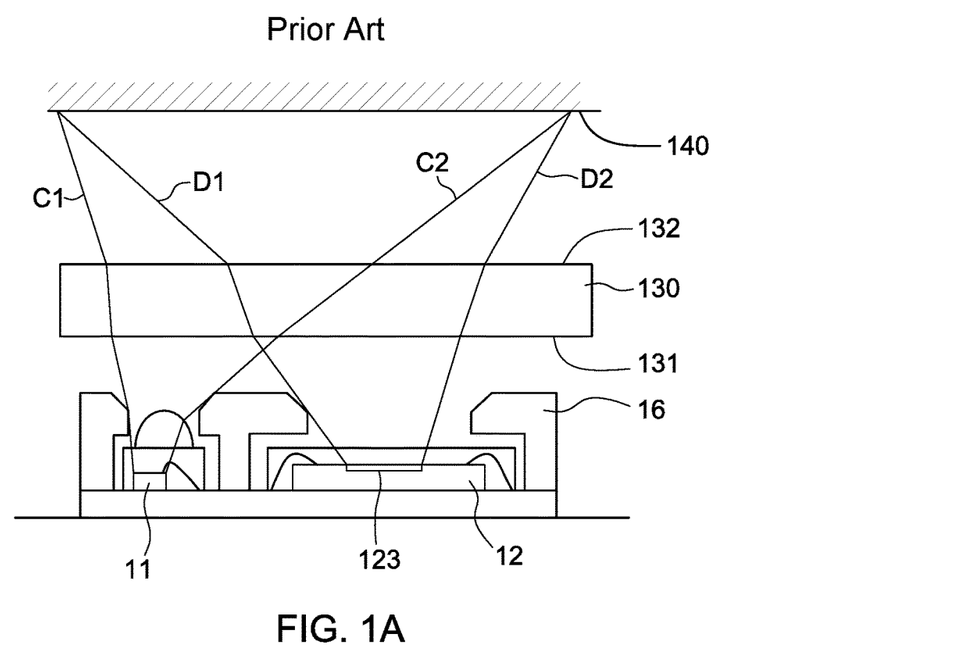
FIG. 1A illustrates a cross-sectional view of an optical sensor module.

FIG. 1A illustrates a cross-sectional view of an optical module. The optical module comprises a light emitting element 11 and a light detector 12, each of which is shown encapsulated by a transparent material. A lid 16 is provided to prevent the light emitted from the light emitting element 11 from reaching a photosensitive area 123 of the light detector 12 directly. Specifically, light emitted by the light emitting element 11 exits the lid 16 within the range between C1 and C2, is reflected from the object 140, is transmitted through the lid 16 within the range D1 and D2 and is received by the photosensitive area 123. Thus, the photosensitive area 123 does not receive light directly from the light emitting element 11. However, the photosensitive area 123 may receive light reflected from a first surface 131 and a second surface 132 of a medium 130 positioned between the lid 16 and the object 140. Such light increases cross talk.

Figure 1B:
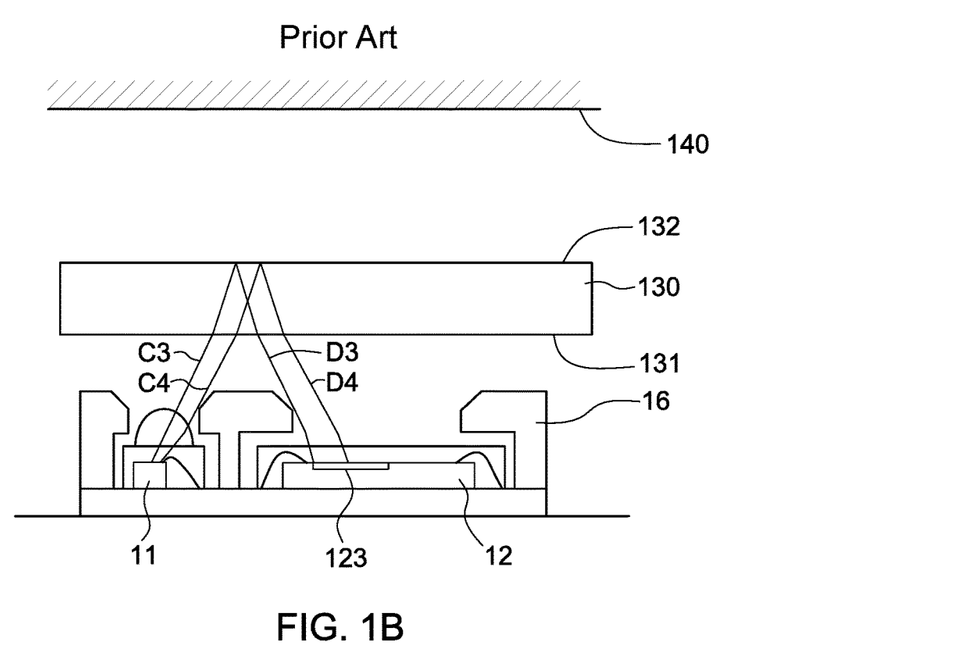
FIG. 1B illustrates a cross-sectional view of an optical sensor module.

FIG. 1B is illustrative. As shown in FIG. 1B, light emitted by light emitting element 11 in two directions C3 and C4 are reflected from the second surface 132 of the medium 130 in respective directions D3 and D4, and reach the photosensitive area 123.

Figure 1C:
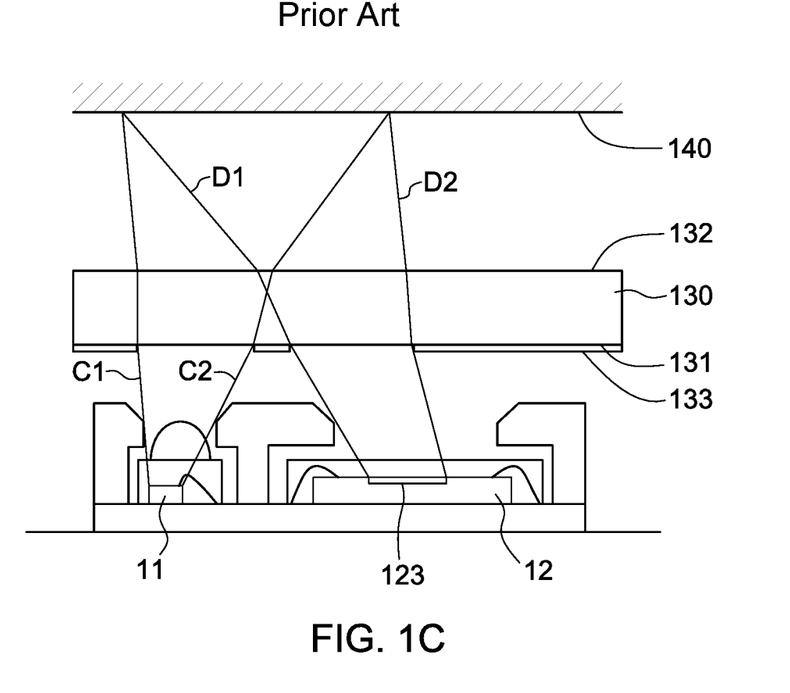
FIG. 1C illustrates a cross-sectional view of an optical sensor module.

FIG. 1C illustrates the addition of an absorption layer 133 to absorb reflection light, such as described with respect to FIG. 1B, that may cause cross talk. The IR absorption layer 133 may be disposed by a printing technology (such as a screen printing technology). However, the printing technology used in the printing of the absorption layer 133 involves the cleaning of contaminants, with corresponding waste, and further incurs additional process time and cost.

FIGS. 2-8 illustrate optical modules with reduced cross talk according to embodiments of the present disclosure, which embodiments do not require use of the printing technologies discussed with respect to FIG. 1C.

Figure 2:
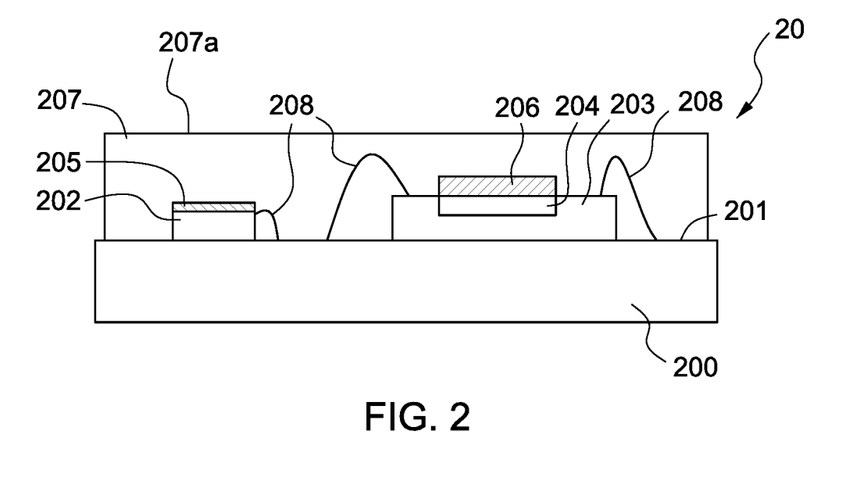
FIG. 2 illustrates a cross-sectional view of an optical module according to an embodiment of the present disclosure.

FIG. 2 illustrates a cross-sectional view of an optical module 20 according to an embodiment of the present disclosure. The optical module 20 includes a carrier 200, a light source structure including a light source 202 and a first polarizer 205, and a light detector structure including a light detector 203, one or more photosensitive areas 204, and a second polarizer 206. The optical module 20 further includes an enclosure 207 and bonding wires 208.

The carrier 200 has an upper surface 201. One or more bonding pads (not shown) may be disposed on, or embedded in, the upper surface 201. One or more circuits (not shown) may be included on or within the carrier 200, and the circuit(s) may be electrically connected to the bonding pad(s).

The light source 202 and the light detector 203 are disposed on the upper surface 201 of the carrier 200. The light source 202 includes one or more light emitting areas. The light source 202 may be, for example, one or more photodiodes. In one or more embodiments, the light source 202 is used to emit an infrared (IR) light, and the light detector is used to detect an IR light. One photosensitive area 204 is illustrated in FIG. 2; however, the light detector 203 may include more than one photosensitive area 204.

The bonding wires 208 electrically connect the light source 202 and the light detector 203 to bonding pads on the upper surface 201; accordingly, when the bonding pads are connected to circuits within the carrier 200, the light source 202 and the light detector 203 may be electrically connected to the circuits by way of the bonding wires 208. For example, the carrier 200 may include a circuit to activate the light source 202 to emit light, and/or may include a circuit to transform an optical signal received by the optical detector 203 to an electrical signal.

The first polarizer 205 is disposed on the light source 202. In one or more embodiments, the first polarizer 205 covers a portion of the light source 202, and in other embodiments, the first polarizer 205 covers most of, or substantially all of, the light source 202. In embodiments in which the light source 202 includes more than one light emitting area, the first polarizer 205 may cover most of, or all of, each light emitting area, and additionally may cover other portions of the light source 202.

The second polarizer 206 is disposed on the light detector 203. In one or more embodiments, the second polarizer 206 covers a portion of the photosensitive area 204, and in other embodiments, the second polarizer 206 covers most of, or substantially all of, the photosensitive area 204. In embodiments in which the light detector 203 includes more than one photosensitive area 204, the second polarizer 206 may cover most of, or all of, each photosensitive area 204, and additionally may cover other portions of the light detector 203.

The enclosure 207 is disposed adjacent to the upper surface 201 of the carrier 200. In one or more embodiments, the enclosure 207 is, or is partially, a material transparent to the emitted and received light. In one or more embodiments, the enclosure 207 encapsulates portions of, or substantially all of, the upper surface 201 of the carrier 200, the light source 202, the light detector 203, the first polarizer 205, the second polarizer 206, and the bonding wire 208. For example, the enclosure may be, or may include, an applied epoxy. The enclosure 207 is useful to protect the components of the optical module 20 without affecting the optical properties of the optical module 20. In one or more embodiments, the enclosure 207 is a lid attached on the carrier 200. For example, the lid may include a liquid crystal polymer. In one or more embodiments, the enclosure 207 is a lid, and the first polarizer 205 and the second polarizer 206 are disposed on the lid.

The first polarizer 205 and the second polarizer 206 have different polarizations, so the light passing through the first polarizer 205 and the second polarizer 206 will correspondingly have different polarization directions. In one or more embodiments, the first polarizer 205 and the second polarizer 206 are polarized so that the light emitted from the light source 202 and passing through the first polarizer 205 will be blocked by the second polarizer 206 from entering the photosensitive area 204. Additionally or alternatively, the polarizations of the first polarizer 205 and the second polarizer 206 provide for blocking light emitted from the light source 202 and reflected from an upper surface 207a of the enclosure 207 from entering the photosensitive area 204. In one or more embodiments, light passing through the first polarizer 205 and light passing through the second polarizer 206 have substantially perpendicular polarization directions to each other.

As seen from the above discussion, the first polarizer 205 together with the second polarizer 206 can reduce or prevent the light emitted from the light source 202 from directly reaching the photosensitive area 204 of the optical detector 203, and/or can reduce or prevent the light emitted from the light source 202 and reflected from the upper surface 207a of the enclosure 207 from reaching the photosensitive area 204 of the optical detector 203. Thus, cross talk may be significantly reduced, or eliminated.

Figure 3:
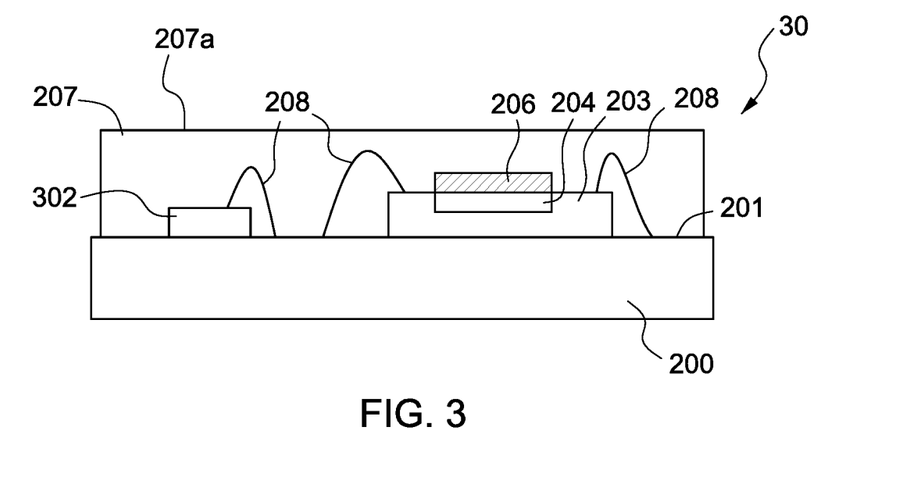
FIG. 3 illustrates a cross-sectional view of an optical module according to an embodiment of the present disclosure.

FIG. 3 illustrates a cross-sectional view of an optical module 30 according to an embodiment of the present disclosure. The optical module 30 of this embodiment is similar to the optical module 20 illustrated in FIG. 2, except that the light source 302 generates a polarized light having a specific polarization direction, and thus the first polarizer 205 (FIG. 2) is omitted from light source structure of the embodiment illustrated in FIG. 3. In one or more embodiments, the light source 302 is a vertical-cavity surface-emitting laser (VCSEL). In one or more embodiments, the light source 302 is a VCSEL that emits IR light.

Light emitted from the light source 302 may have a polarization direction different from that of the light that is permitted to pass through the second polarizer 206 on the photosensitive area 204. In one or more embodiments, the light emitted from the light source 302 may have a polarization direction substantially perpendicular to light that is permitted to pass through the second polarizer 206 on the photosensitive area 204. For example, the light source 302 may emit a light having a vertical polarization direction (for example, an out of plane direction) and the second polarizer 206 may admit a light having a parallel polarization direction (for example, an in-plane direction), or vice versa.

Because the light emitted from the light source 302 can have a polarization direction substantially perpendicular to that of the light that is permitted to pass through the second polarizer 206 on the photosensitive area 204, the second polarizer 206 can block the light directly received from the light source 302 from reaching the photosensitive area 204. In addition, the second polarizer 206 can also block the light emitted from the light source 302 and reflected from the upper surface 207a of the enclosure 207 from reaching the photosensitive area 204. In other words, the second polarizer 206 can prevent cross talk caused by the light emitted from the light source 302, while detecting the light emitted by the light source 302 and reflected from an external object.

Figure 4:
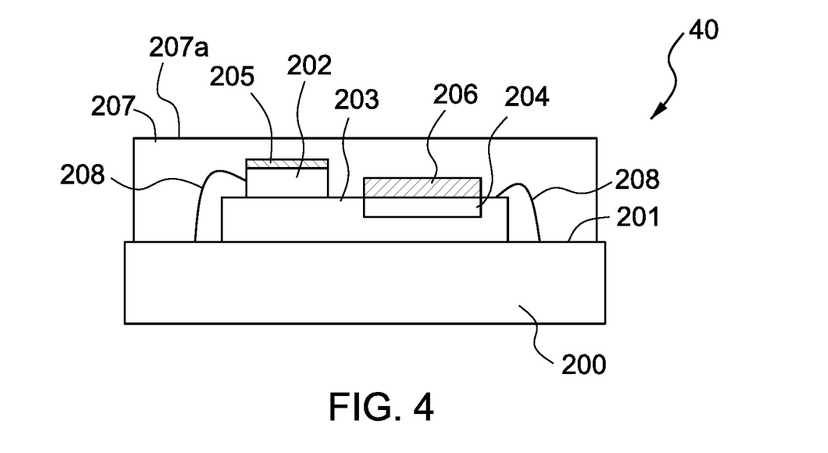
FIG. 4 illustrates a cross-sectional view of an optical module according to an embodiment of the present disclosure.

FIG. 4 illustrates a cross-sectional view of an optical module 40 according to an embodiment of the present disclosure. The optical module 40 of this embodiment is similar to the optical module 20 illustrated in FIG. 2, except that the light source structure (the light source 202 and the first polarizer 205) on the light source 202) are disposed adjacent to the upper surface of the light detector 203 in FIG. 4, rather than being adjacent to the upper surface 201 as illustrated in FIG. 2. Because the light source 202 and the first polarizer 205 are disposed adjacent to the upper surface of the light detector 203 in the embodiment of FIG. 4, a size of the optical module 40 can be smaller as compared to that of the optical module 20 in FIG. 2. The reduction in size may help to reduce the cost of the optical module 40 as compared to the optical module 20, such as by reducing an amount and corresponding cost of the transparent material for the enclosure 207, and reducing a size and corresponding cost of the carrier 200.

In the embodiment of FIG. 4, although a distance between the light source 202 and the photosensitive area 204 is reduced, the light emitted from the light source 202, and the light emitted from the light source 202 and reflected by the enclosure 207, can still be blocked from entering the photosensitive area 204 by selected polarizations of the first polarizer 205 and the second polarizer 206. In other words, although the optical module 40 is relatively small compared to the optical module 20, the optical module 40 also reduces or eliminates cross talk caused by light emitted from the light source 202. Therefore, the techniques of the present disclosure are particularly useful for satisfying specifications related to decreasing optical module size.

Figure 5:
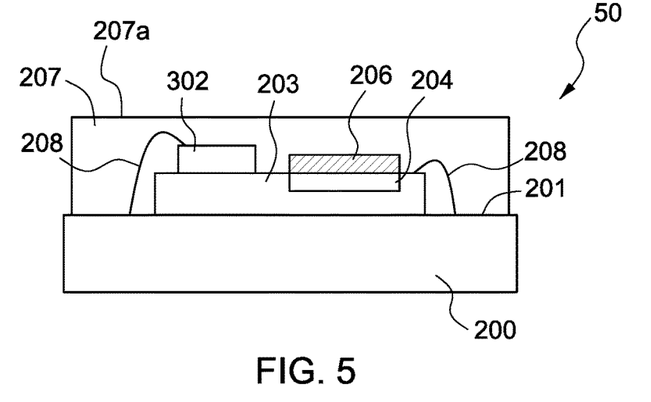
FIG. 5 illustrates a cross-sectional view of an optical module according to an embodiment of the present disclosure.

FIG. 5 illustrates a cross-sectional view of an optical module 50 according to an embodiment of the present disclosure. The optical module 50 of this embodiment is similar to the optical module 40 illustrated in FIG. 4, except that the light source 302 can generate a light having a specific polarization direction, and thus the first polarizer 205 on the light source 202 (FIG. 4) is omitted in the embodiment of FIG. 5. In one or more embodiments, the light source 302 of FIG. 5 is a VCSEL. In one or more embodiments, the light source 302 is a VCSEL that emits an IR light.

The light emitted from the light source 302 may have a polarization direction different from that of the light that is permitted to pass through the second polarizer 206 on the photosensitive area 204. In one or more embodiments, the light emitted from the light source 302 has a polarization direction substantially perpendicular to that of the light that is permitted to pass through the second polarizer 206 on the photosensitive area 204. For example, the light source 302 can emit a light having a vertical polarization direction (for example, an out of plane direction) and the second polarizer 206 can admit a light having a parallel polarization direction (for example, an in-plane direction), or vice versa.

Because the light emitted from the light source 302 can have a polarization direction substantially perpendicular to that of the light that is permitted to pass through the second polarizer 206 on the photosensitive area 204, the second polarizer 206 can block the light received directly from the light source 302 from reaching the photosensitive area 204. In addition, the second polarizer 206 can also block the light emitted from the light source 302 and reflected from the upper surface 207a of the enclosure 207 from reaching the photosensitive area 204. In other words, the second polarizer 206 can prevent cross talk caused by the light emitted from the light source 302, while detecting the light emitted by the light source 302 and reflected from an external object.

Figure 6:
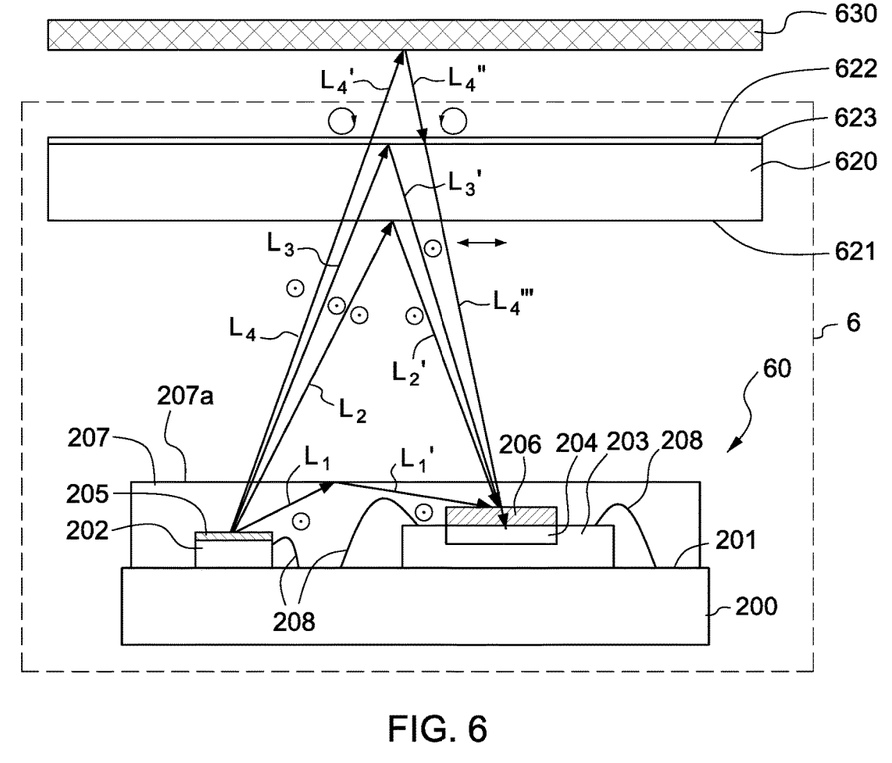
FIG. 6 illustrates a cross-sectional view of an electronic device according to an embodiment of the present disclosure.

FIG. 6 illustrates a cross-sectional view of an electronic device 6 according to an embodiment of the present disclosure. The electronic device 6 includes an optical module 60 and a transparent sheet 620. In the embodiment of FIG. 6, the optical module 60 is similar to the optical module 20 depicted in FIG. 2. In other embodiments, the optical module 60 is similar to one of the optical modules 30, 40, and 50 depicted in FIG. 3, FIG. 4, and FIG. 5, respectively.

The transparent sheet 620 has a first surface 621 and a second surface 622. The second surface 622 is opposite to the first surface 621. The transparent sheet 620 can be, for example, a glass sheet (for example, a surface glass of a display of a mobile phone, or a cover glass attached on the optical module), or an equivalent thereof. The transparent sheet 620 includes a ¼λ waveplate 623 adjacent to the second surface 622. In one or more embodiments, the ¼λ waveplate 623 is alternatively disposed adjacent to the first surface 621 of the transparent sheet 620. In one or more embodiments, the ¼λ waveplate 623 is, or includes, a birefringence material. In one or more embodiments, the ¼λ waveplate 623 is a multilayer film. The ¼λ waveplate 623 may be disposed by adhesion, or by one or more coating techniques, such as by a chemical vapor deposition technique.

The ¼λ waveplate 623 is characterized as having a fast axis and a slow axis. If an incident light forms an angle of 0 degrees with the fast axis or the slow axis, the light exiting the ¼λ waveplate 623 will have a linear polarization. If an incident light forms an angle of 45 degrees with the fast axis or the slow axis, the light exiting the ¼λ waveplate 623 will have a circular polarization. If an incident light forms an angle between 0 degrees and 45 degrees with the fast axis or the slow axis, the light exiting the ¼λ waveplate 623 will have an oval polarization.

Accordingly, the ¼λ waveplate 623 can change the polarization state of the light passing through it, where polarization state refers to a linear, circular, or oval nature of the polarization. In the embodiment illustrated in FIG. 6, linearly-polarized light passing through the transparent sheet 620 and then through the ¼λ waveplate 623 will become circularly-polarized, and circularly-polarized light passing through the ¼λ waveplate 623 and then through the transparent sheet 620 will become linearly-polarized.

In the embodiment illustrated in FIG. 6, examples are shown of light emitted in four directions from the light source 202, illustrated as light rays L1, L2, L3, and L4. In this embodiment, the first polarizer 205 allows light having a vertical polarization to pass through (for example, an out-of-plane direction). Each of the light rays L1, L2, L3, and L4 passing through the first polarizer 205 has a vertical polarization, as illustrated in FIG. 6 by a circle surrounding a dot.

The light ray L1 with vertical polarization is reflected by the upper surface 207a of the enclosure 207, and becomes a reflection light ray L1' with vertical polarization. The reflection light ray L1' will be blocked by the second polarizer 206 from entering the photosensitive area 204, because the second polarizer 206 allows light having a parallel direction to pass through (for example, an in-plane direction). In other words, the reflection light ray L1' that is undesirable and may cause cross talk is blocked from passing through the second polarizer 206 and reaching the photosensitive area 204.

The light ray L2 with vertical polarization is reflected by the first surface 621 of the transparent sheet 620 and becomes a reflection light ray L2' with vertical polarization, so also will be blocked by the second polarizer 206 from entering the photosensitive area 204. In other words, the reflection light ray L2' that is undesirable and may cause cross talk is blocked from passing through the second polarizer 206 and reaching the photosensitive area 204.

The light ray L3 with vertical polarization is reflected by the second surface 622 of the transparent sheet 620 and becomes a reflection light ray L3' with vertical polarization, so also will be blocked by the second polarizer 206 from entering the photosensitive area 204. In other words, the reflection light ray L3' that is undesirable and may cause cross talk will be blocked from passing through the second polarizer 206 and reaching the photosensitive area 204.

The light ray L4 with vertical polarization becomes a circularly-polarized light ray L4' having a right handedness direction (the clockwise direction as illustrated in the embodiment in FIG. 6) after passing through the ¼λ waveplate 623. In other words, the polarization of the light ray L4' will change from a linear vertical polarization to a right handedness circular polarization by passing through the ¼λ waveplate 623.

The circularly-polarized light ray L4' having a right handedness direction may be reflected from an object 630 outside of the electronic device 6 (for example, reflected from a surface of a mobile phone) as a circularly-polarized light ray L4'' having a left handedness direction, which is transformed into a light ray L4''' having a linear polarization by passing through the ¼λ waveplate 623. The light ray L4''' further is parallel, as indicated by the double-sided arrow in FIG. 6. The second polarizer 206 on the photosensitive area 204 allows parallel light with a linear polarization to pass through. Therefore, the linearly-polarized parallel light ray L4''' is allowed to pass through the second polarizer 206 and reach the photosensitive area 204, and thus be detected. The light detector 203 can then transform the detected light ray L4''' into an electrical signal.

The arrangement of the first polarizer 205, the second polarizer 206, and the ¼λ waveplate 623 allows the electronic device 6 to receive the light emitted from the light source 202 and reflected from the external object 630, while reducing cross talk, without using shielding. Accordingly, a size of the optical module 60, or the size of an electronic device incorporating the optical module 60, can be greatly reduced. Additionally, complexity and cost of manufacturing may be reduced by omitting shielding. Moreover, the first polarizer 205, the second polarizer 206, and the ¼λ waveplate 623 may be formed by technologies other than screen printing, therefore the pollution and manufacturing costs of screen printing are avoided.

Figure 7A:
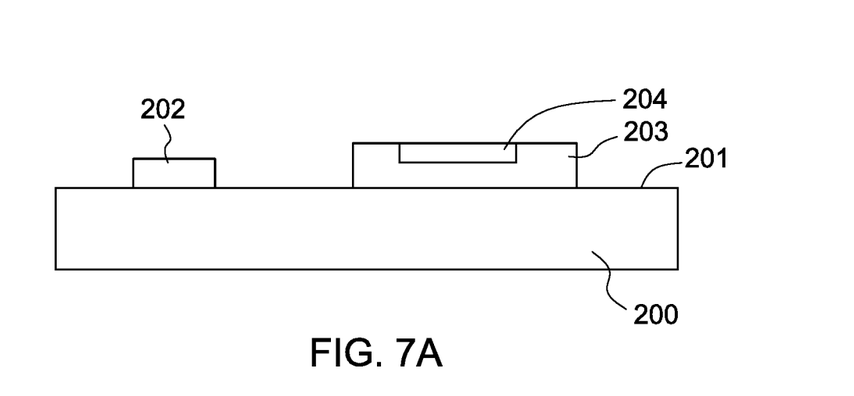
FIG. 7A, FIG. 7B, and FIG. 7C illustrate a process of manufacturing an optical module according to an embodiment of the present disclosure.
Figure 7B:
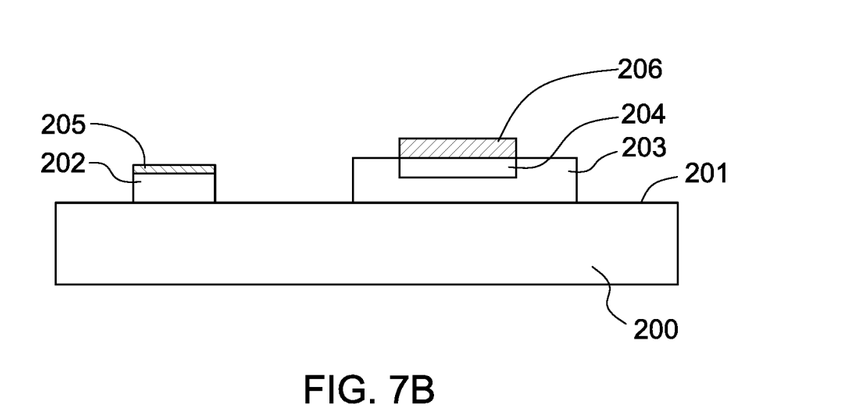
Figure 7C:
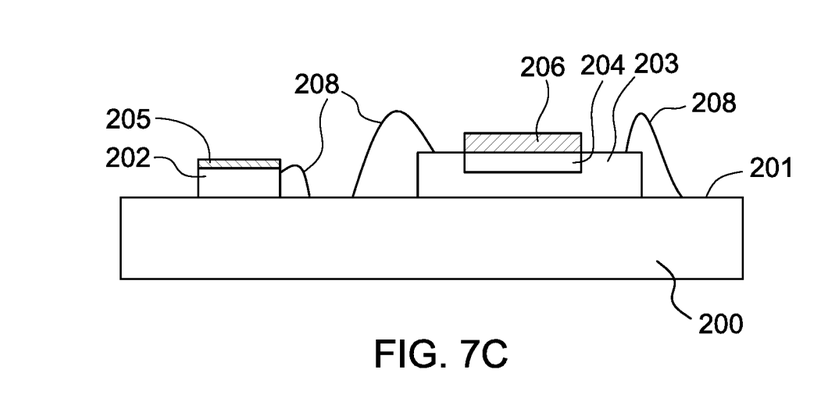

FIGS. 7A-7C illustrate a process of manufacturing an optical module according to an embodiment of the present disclosure.

Referring to FIG. 7A, a carrier 200 is provided. The carrier 200 has an upper surface 201. The carrier may be a printed circuit board, a substrate, or other carrier. In one or more embodiments, the carrier 200 includes one or more traces, one or more wire-bonding pads, one or more vias, or a combination thereof, which may be positioned on and/or below the upper surface 201. In one or more embodiments, the carrier 200 is one of, or a combination of, an organic material, a polymer material, silicon, silicon dioxide, or other silicide.

A light source 202 and a light detector 203 are disposed on the upper surface 201 of the carrier 200. In one or more embodiments, the light source 202 and the light detector 203 are attached to the carrier 200 by an adhesive, which may be a conductive or a non-conductive adhesive. In one or more embodiments, the light source 202 is a light emitting diode. In one or more embodiments, the light detector 203 is a photodiode.

The light detector 203 includes a photosensitive area 204 (or multiple photosensitive areas 204). In the embodiment illustrated in FIG. 7A, the photosensitive area 204 covers an area that is a portion of an area of the upper surface of the light detector 203. In other embodiments, the photosensitive area 204 covers most of, or substantially all of, the upper surface of the light detector 203.

Referring to FIG. 7B, a first polarizer 205 is disposed on the light source 202. In the embodiment illustrated in FIG. 7B, the first polarizer 205 covers most of, or substantially all of, an upper surface of the light source 202. In other embodiments, the first polarizer 205 covers a portion of the upper surface of the light source 202. A second polarizer 206 is disposed on the light detector 203. In the embodiment illustrated in FIG. 7B, the second polarizer 206 covers most of, or substantially all of, an upper surface of the photosensitive area 204. In other embodiments, the second polarizer 206 covers a portion of the upper surface of the light detector 203. In one or more embodiments, one or both of the first polarizer 205 and the second polarizer 206 are disposed on the light source 202 and the photosensitive area 204, respectively, by adhesion, such as by using an adhesive material. Examples of adhesive materials are materials including one of, or a combination of, an epoxy and a silicone.

In one or more embodiments, one of (or both of) the first polarizer 205 and the second polarizer 206 includes a thermostable material, such as a thermostable metal. In one or more embodiments, one of (or both of) the first polarizer 205 and the second polarizer 206 is a metal polarizer that is thermostable at a temperature of up to about 200° C., to avoid deformation or malfunction at an elevated temperature, and thus is suitable for IR light polarization. In one or more embodiments, one of (or both of) the first polarizer 205 and the second polarizer 206 is a ProFlux™ polarizer produced by Polatechno Co., Ltd.

In the embodiment illustrated in FIG. 7B, the light passing through the first polarizer 205 and the light passing through the second polarizer 206 may have different polarization directions. In one or more embodiments, the light passing through the first polarizer 205 has a polarization direction perpendicular to that of the light passing through the second polarizer 206. For example, the first polarizer 205 can allow a light having a vertical polarization direction (for example, an out-of-plane direction) to pass through, and the second polarizer 206 can allow a light having a parallel polarization direction (for example, an in-plane direction) to pass through, or vice versa.

Referring to FIG. 7C, the light source 202 and the light detector 203 can be electrically connected to bonding pads (not shown) on the upper surface 201 of the carrier 200 by wire bonds 208. In one or more embodiments, the bonding pads electrically connect to circuits (not shown) on or within the carrier 200.

Then, in one or more embodiments, a transparent material is applied to cover or encapsulate portions of, or substantially all of, the upper surface 201 of the carrier 200, the light source 202, the light detector 203, the first polarizer 205, the second polarizer 206, and the wire bonds 208. In this manner, the enclosure 207 illustrated in FIG. 2 may be formed, and the optical module 20 obtained. In one or more embodiments, the transparent material is applied by molding or press molding. The transparent material may include, for example, a transparent encapsulant material such as an epoxy.

In one or more embodiments, the process illustrated in FIGS. 7A-7C is applied to concurrently form multiple optical modules arranged in a row or in an array. Such concurrently-formed optical modules may then be singulated into independent optical modules such as the optical module 20 illustrated in FIG. 2.

In one or more embodiments, the carrier 200 is disposed on a circuit or device by a surface mount technology (SMT). In such embodiments, a temperature of the SMT process is preferably controlled below about 200° C., so the first polarizer 205 and the second polarizer 206 are not damaged. As such, in some embodiments, a solder paste with a working temperature below about 200° C. is used in the SMT process. In one or more embodiments, the solder paste is NC-SNQ81 produced by Joy Victor, Co., Ltd.

Figure 8A:
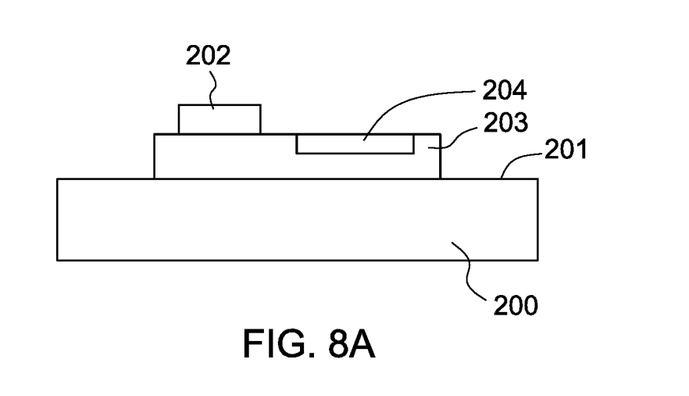
FIG. 8A, FIG. 8B, and FIG. 8C illustrate a process of manufacturing an optical module according to an embodiment of the present disclosure.
Figure 8B:
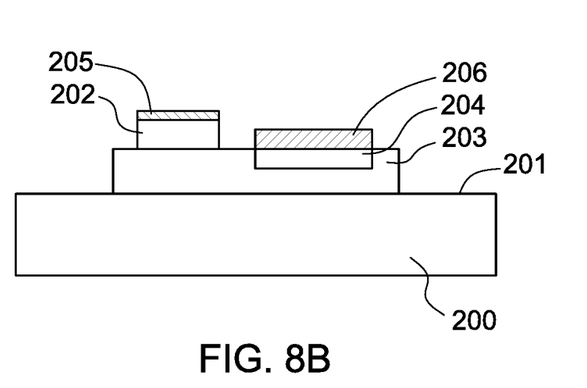
Figure 8C:
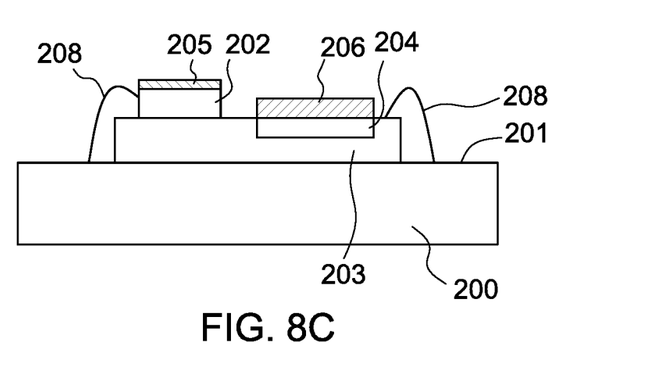

FIGS. 8A-8C illustrate a process of manufacturing an optical module according to an embodiment of the present disclosure.

Referring to FIG. 8A, a carrier 200, a light source 202, and a light detector 203 are provided. The carrier 200 has an upper surface 201. The light detector 203 is disposed adjacent to the upper surface 201 of the carrier 200. In one or more embodiments, the light detector 203 is attached to the upper surface 201 by an adhesive, which may be a conductive or a non-conductive adhesive. The light source 202 is disposed adjacent to an upper surface of the light detector 203, and is spaced apart from the photosensitive area 204, such that the light source 202 does not cover or overlap the photosensitive area 204.

Referring to FIG. 8B, a first polarizer 205 is disposed on the light source 202. In the embodiment illustrated in FIG. 8B, the first polarizer 205 covers most of, or substantially all of, an upper surface of the light source 202. In other embodiments, the first polarizer 205 covers a portion of the upper surface of the light source 202. A second polarizer 206 is disposed on the photosensitive area 204 of the light detector 203. In the embodiment illustrated in FIG. 8B, the second polarizer 206 covers most of, or substantially all of, the photosensitive area 204. In other embodiments, the second polarizer 206 covers a portion of an upper surface of the photosensitive area 204.

In one or more embodiments, one or both of the first polarizer 205 and the second polarizer 206 are disposed on the light source 202 and the photosensitive area 204, respectively, by adhesion, such as by using an adhesive material. Examples of adhesive materials are materials including one of, or a combination of, an epoxy and a silicone.

Referring to FIG. 8C, the light source 202 and the light detector 203 can be electrically connected to bonding pads (not shown) on an upper surface 201 of the carrier 200 by wire bonds 208. In one or more embodiments, the bonding pads electrically connect to circuits (not shown) on or within the carrier 200.

Then, in one or more embodiments, a transparent material is applied to cover or encapsulate portions of, or substantially all of, the upper surface 201 of the carrier 200, the light source 202, the light detector 203, the first polarizer 205, the second polarizer 206, and the wire bonds 208. In this manner, the enclosure 207 illustrated in FIG. 4 may be formed, and the optical module 40 obtained. In one or more embodiments, the transparent material is applied by molding or press molding. The transparent material may include, for example, a transparent encapsulant material such as an epoxy.

In one or more embodiments, the process illustrated in FIGS. 8A-8C is applied to concurrently form multiple optical modules arranged in a row or in an array. Such concurrently-formed optical modules may then be singulated into independent optical modules such as the optical module 20 illustrated in FIG. 2.

In one or more embodiments, the carrier 200 is disposed on a circuit or device by SMT. In such embodiments, a temperature of the SMT process is preferably controlled below about 200° C., so the first polarizer 205 and the second polarizer 206 are not damaged. As such, in some embodiments, a solder paste with a working temperature below about 200° C. is used in the SMT process. In one or more embodiments, the solder paste is NC-SNQ81 produced by Joy Victor, Co., Ltd.

As used herein and not otherwise defined, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to $\pm 10\%$, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$. As another example, two values, such as characterizing a size in terms of a width or a height, can be substantially the same or matching if a difference between the values is less than or equal to $\pm 10\%$ of an average of the values, such as less than or equal to $\pm 5\%$, less than or equal to $\pm 4\%$, less than or equal to $\pm 3\%$, less than or equal to $\pm 2\%$, less than or equal to $\pm 1\%$, less than or equal to $\pm 0.5\%$, less than or equal to $\pm 0.1\%$, or less than or equal to $\pm 0.05\%$. As another example, "substantially perpendicular" can refer to $90°\pm 10°$, such as $90°\pm 5°$, $90°\pm 4°$, $90°\pm 3°$, $90°\pm 2°$, $90°\pm 1°$, $90°\pm 0.5°$, $90°\pm 0.1°$, or $90°\pm 0.05°$.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a carrier having a first surface;
   a light source disposed adjacent to the first surface;
   a light detector disposed adjacent to the first surface;
   a first polarizer disposed on the light detector, wherein light emitted from the light source has a first polarization direction substantially perpendicular to a second polarization direction of light permitted through the first polarizer; and
   a transparent sheet, having a first surface and a second surface opposite to the first surface, the first surface of the transparent sheet facing the first surface of the carrier, the second surface of the transparent sheet comprising a waveplate configured to transform the light emitted from the light source and passing through the waveplate into light having a different polarization state.

2. The electronic device of claim 1, wherein the waveplate comprises a ¼λ waveplate.

3. The electronic device of claim 1, wherein the light emitted from the light source has a linear polarization and the waveplate is configured to transform the light emitted from the light source and passing through the waveplate into light having a circular polarization.

4. The electronic device of claim 1, wherein the waveplate is configured to transform reflected light having a circular polarization and passing through the waveplate into light having a linear polarization.

5. The electronic device of claim 1, wherein the light source comprises a vertical-cavity surface-emitting laser.

6. The electronic device of claim 1, wherein the light detector comprises one or more photosensitive areas, and the first polarizer covers at least one photosensitive area.

7. The electronic device of claim 1, wherein the light detector comprises a photosensitive area, and the first polarizer covers substantially all of the photosensitive area.

8. The electronic device of claim 1, further comprising a second polarizer disposed on the light source, wherein the second polarizer is configured to polarize the light emitted from the light source into the first polarization direction.

9. The electronic device of claim 1, wherein the light source comprises one or more light emitting areas, and the second polarizer covers at least one light emitting area.

10. A process of manufacturing an optical module, comprising:
    providing a carrier, the carrier having a first surface;
    disposing a light source structure adjacent to the first surface, the light source structure configured to emit light in a first polarization direction;
    disposing a light detection structure adjacent to the first surface, the light detection structure configured to admit light in a second polarization direction, wherein the first polarization direction is substantially perpendicular to the second polarization direction; and
    disposing a transparent sheet above the light source structure and the light detection structure, the transparent sheet having a first surface and a second surface opposite to the first surface, the first surface of the transparent sheet facing the first surface of the carrier, the second surface of the transparent sheet comprising a waveplate configured to transform the light emitted from the light source structure and passing through the waveplate into light having a different polarization state.

11. The process of claim 10, wherein the light source structure comprises a light source and a first polarizer, and disposing the light source structure comprises disposing the light source adjacent to the first surface and disposing the first polarizer on the light source.

12. The process of claim 11, wherein the light source comprises one or more light emitting areas, and the first polarizer covers at least one light emitting area.

13. The process of claim 11, wherein the light detection structure comprises a light detector and a second polarizer, and disposing the light detection structure comprises disposing the light detector adjacent to the first surface and disposing the second polarizer on the light detector, and wherein the light detector comprises at least one photosensitive area, and the second polarizer is disposed adjacent to the at least one photosensitive area.

14. An electronic device, comprising:
    a light source;
    a light detector;
    an enclosure encapsulating the light source and the light detector;
    a waveplate configured to cover the light source and the light detector such that a first light beam emitted from the light source passes through the waveplate and reaches an object, and the first light beam reflected by the object passes through the waveplate and reaches the light detector; and
    a transparent sheet, having a first surface and a second surface opposite to the first surface, the first surface of the transparent sheet facing the light source, wherein the waveplate is disposed adjacent to one of the first surface or the second surface of the transparent sheet.

15. The electronic device of claim 14, further comprising a polarizer disposed on the light detector, wherein the first light beam emitted from the light source has a first polarization direction substantially perpendicular to a second polarization direction of light permitted through the polarizer.

16. The electronic device of claim 14, wherein the waveplate comprises a ¼λ waveplate.

17. The electronic device of claim 14, wherein the light source is a vertical-cavity surface-emitting laser.

18. The electronic device of claim 14, wherein the waveplate is disposed outside of the enclosure.

19. The electronic device of claim 14, wherein the waveplate is configured to transform the first light beam emitted from the light source in a first polarization state into a second polarization state and to transform the first light beam reflected from the object in a third polarization state into a fourth polarization state.

20. The electronic device of claim 19, wherein the first polarization state has a linear polarization, and the second polarization state has a circular polarization.

21. The electronic device of claim 19, wherein the third polarization state has a circular polarization, and the fourth polarization state has a linear polarization.

22. The electronic device of claim 19, wherein light in the fourth polarization state has a polarization direction substantially perpendicular to a polarization direction of light in the first polarization state.

23. The electronic device of claim 19, further comprising a polarizer disposed on the light source, wherein the polarizer is configured to polarize the first light beam emitted from the light source into the first polarization state.

* * * * *